United States Patent [19]
Sassa et al.

[11] Patent Number: 5,652,438
[45] Date of Patent: Jul. 29, 1997

[54] LIGHT-EMITTING SEMICONDUCTOR DEVICE USING GROUP III NITRIDE COMPOUND

[75] Inventors: Michinari Sassa; Makoto Tamaki; Masayoshi Koike; Naoki Shibata; Masami Yamada; Takahide Oshio, all of Aichi-ken, Japan

[73] Assignee: Toyoda Gosei Co., Ltd., Aichi-ken, Japan

[21] Appl. No.: 504,340

[22] Filed: Jul. 19, 1995

[30] Foreign Application Priority Data

Jul. 20, 1994 [JP] Japan ................... 6-191058

[51] Int. Cl.⁶ .................................................. H01L 33/00
[52] U.S. Cl. ........................ 257/94; 257/95; 257/96; 257/97; 257/99; 257/103
[58] Field of Search ..................... 257/103, 99, 95, 257/94, 96, 97

[56] References Cited

U.S. PATENT DOCUMENTS

| | | | |
|---|---|---|---|
| 5,281,830 | 1/1994 | Kotaki et al. | 257/99 X |
| 5,323,952 | 6/1994 | Kato et al. | 228/102 |
| 5,369,289 | 11/1994 | Tamaki et al. | 257/99 |
| 5,408,120 | 4/1995 | Manabe et al. | 257/103 X |
| 5,530,282 | 6/1996 | Tsuji | 257/666 |

FOREIGN PATENT DOCUMENTS

| | | | |
|---|---|---|---|
| 4321279 | 11/1992 | Japan | 257/99 |
| 5211347 | 8/1993 | Japan | 257/103 |

*Primary Examiner*—William Mintel
*Attorney, Agent, or Firm*—Cushman Darby & Cushman, IP Group of Pillsbury Madison & Sutro LLP

[57] ABSTRACT

A light-emitting semiconductor device (10) consecutively has a sapphire substrate (1), an AlN buffer layer (2), a silicon (Si) doped GaN $n^+$-layer (3) of high carrier (n-type) concentration, a Si-doped $(Al_{x2}Ga_{1-x2})_{y2}In_{1-y2}N$ $n^+$-layer (4) of high carrier (n-type) concentration, a zinc (Zn) and Si-doped $(Al_{x1}Ga_{1-x1})_{y1}In_{1-y1}N$ emission layer (5), and a Mg-doped $(Al_{x2}Ga_{1-x2})_{y2}In_{1-y2}N$ p-layer (6). The AlN buffer layer (2) has a 500 Å thickness. The GaN $n^+$-layer (3) is about 2.0 μm thick and has a $2 \times 10^{18}/cm^3$ electron concentration. The $n^+$-layer (4) is about 2.0 μm thick and has a $2 \times 10^{18}/cm^3$ electron concentration. The emission layer (5) is about 0.5 μm thick. The p-layer 6 is about 1.0 μm thick and has a $2 \times 10^{17}/cm^3$ hole concentration. Nickel electrodes (7, 8) are connected to the p-layer (6) and $n^+$-layer (4), respectively. A groove (9) electrically insulates the electrodes (7, 8). Lead lines (21, 22) are connected with the electrodes (7, 8) by a wedge bonding method to desirably reduce the surface area of the electrodes on the light-emitting side of the device upon which the electrodes are situated to thereby increase light emission from the device.

26 Claims, 5 Drawing Sheets

LIGHT-EMITTING SEMICONDUCTOR DEVICE USING GROUP III NITRIDE COMPOUND

BACKGROUND OF THE INVENTION

1. Field of the Invention

The present invention relates to a light-emitting semiconductor device that emits blue light and uses a Group III nitride compound. Specifically, the invention relates to reducing the surface areas occupied by electrodes or bonding pads on a surface layer of the device to increase the quantity of light emitted from the device.

2. Description of the Prior Art

It has been known that an aluminum gallium indium nitride (AlGaInN) compound semiconductor may be used to obtain a light-emitting diode (LED) which emits blue light. This semiconductor device is useful because of its high luminous efficiency resulting from direct electron transition and because of its ability to emit blue light, which is one of the three primary colors.

Irradiating an electron beam into and heat treatment of a magnesium (Mg) doped i-layer alters it to exhibit p-type conduction. As a result, an LED with a double hereto p-n junction structure made of an aluminum gallium nitride (AlGaN) p-layer, a zinc (Zn) doped indium gallium nitride (InGaN) emission layer, and an AlGaN n-layer becomes useful instead of a conventional LED of metal insulator semiconductor (MIS) structure which includes an n-layer and a semi-insulating i-layer.

As an example, the conventional LED with a double hetero-junction structure has a sapphire substrate on which an AlN buffer layer, a Si-doped layer, a Si- and Zn-doped layer, and a Mg-doped layer are consecutively formed. Electron irradiation or heat treatment in an atmosphere of nitrogen gases is carried out to change the Mg-doped layer into a layer with p-type conduction.

Figure 9:
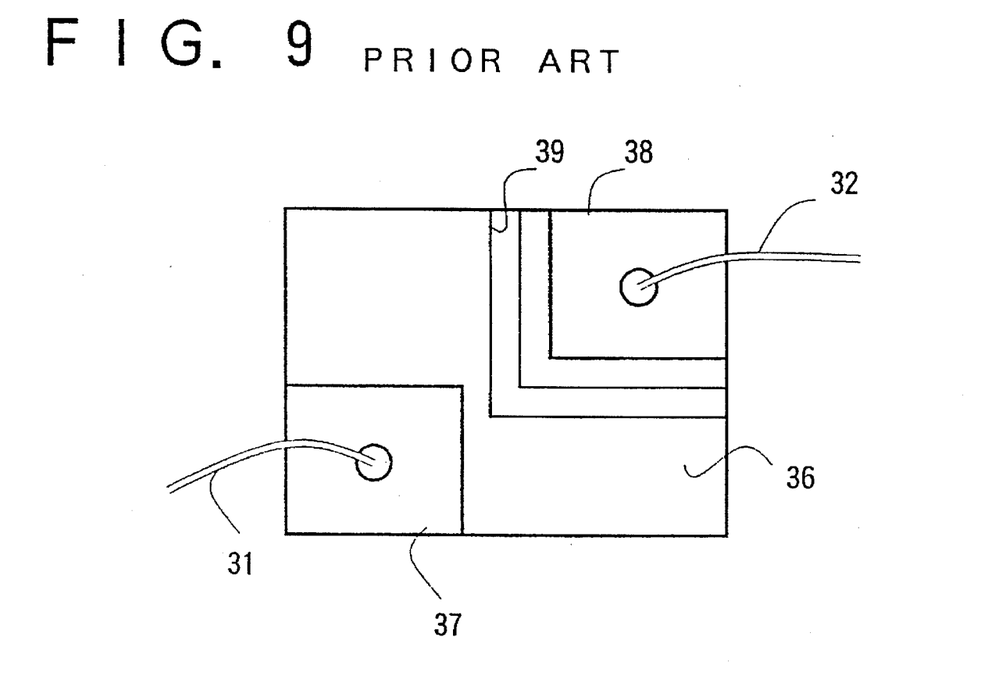
FIG. 9 is a top view of a conventional LED showing a ball-type bonding structure.

The conventional LED requires a relatively large surface area for ball bonding-type connections between its bonding pads or electrodes and its bonding wire. As shown in FIG. 9 (a top view of the LED), a bonding pad or electrode 37 for a p-layer 36 and an another electrode 38 for an n-layer and an emission layer (not shown) are formed on the p-layer 36. Gold (Au) bonding wires 31 and 32, which are fabricated by a wire bonding method utilizing a conventional ball bonding tool, connect the electrodes 37 and 38 with their lead pins (not shown). This ball bonding tool requires electrodes with a relatively large surface area; the surface area occupied by the electrodes being opaque such that it impedes light emission from that light-emitting side of the device upon which the bonding pads or electrodes 37, 38 are situated. Consequently, the conventional LED results in poor luminous emission.

SUMMARY OF THE INVENTION

It is, therefore, an object of the present invention to solve the above problem and improve the luminous intensity.

According to the first aspect of the invention, there is provided a light-emitting semiconductor device constituted by:

an n-layer with n-type conduction of Group III nitride compound semiconductor satisfying the formula $Al_{x3}Ga_{y3}In_{1-x3-y3}N$, inclusive of $x3=0$, $y3=0$ and $x3=y3=0$;

a p-layer with p-type conduction of Group III nitride compound semiconductor satisfying the formula $Al_{x1}Ga_{y1}In_{1-x1-y1}N$, inclusive of $x1=0$, $y1=0$ and $x1=y1=0$;

an emission layer of Group III nitride compound semiconductor satisfying the formula $Al_{x2}Ga_{y2}In_{1-x2-y2}N$, inclusive of $x2=0$, $y2=0$ and $x2=y2=0$;

a junction structure of the n-layer, the p-layer, and the emission layer being any one of a homo-junction structure, a single hereto-junction structure, and a double heterojunction structure; and a first electrode for the p-layer and a second electrode for the n-layer formed on a surface of a light-emitting side of the device; and the wedge-bonded wires connected, respectively, to the first and second electrodes.

The surface area of the electrodes or bonding pads on the light-emitting side of the device upon which the electrodes are formed, which impede light emission, are beneficially minimized. Consequently, the luminous intensity of the LED is improved.

Other objects, features, and characteristics of the present invention will become apparent upon consideration of the following description in the appended claims with reference to the accompanying drawings, all of which form a part of the specification, and wherein referenced numerals designate corresponding parts in the various figures.

DETAILED DESCRIPTION OF THE PREFERRED EMBODIMENT

The invention will be more fully understood by reference to the following examples.

EXAMPLE 1

Figure 1:
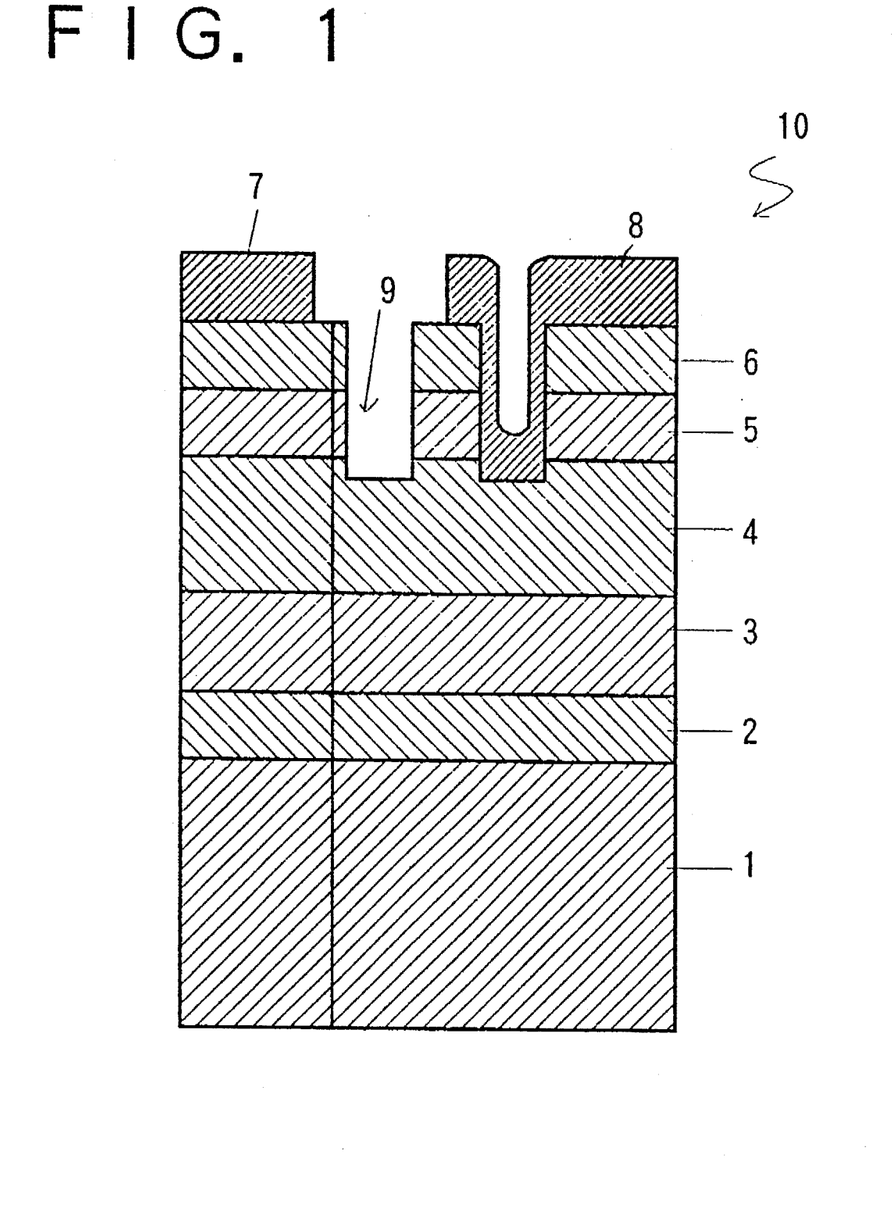
FIG. 1 is a diagram showing the structure of the LED embodied in the example.

FIG. 1 shows an LED 10 embodied in Example 1. It has a sapphire ($Al_2O_3$) substrate 1 upon which the following five layers are consecutively formed: an AlN buffer layer 2; a silicon (Si) doped GaN $n^+$-layer 3 of high carrier (n-type) concentration; a Si-doped $(Al_{x2}Ga_{1-x2})_{y2}In_{1-y2}N$ $n^+$-layer 4 of high carrier (n-type) concentration; a cadmium (Cd) and Si-doped $(Al_{x1}Ga_{1-x1})_{y1}In_{1-y1}N$ emission layer 5; and a Mg-doped $(Al_{x2}Ga_{1-x2})_{y2}In_{1-y2}N$ p-layer 6. The AlN layer 2 has a 500 Å thickness. The GaN $n^+$-layer 3 is about 2.0 μm in thickness and has a $2 \times 10^{18}/cm^3$ electron concentration. The $n^+$-layer 4 is about 2.0 μm in thickness and has a $2 \times 10^{18}/cm^3$ electron concentration. The emission layer 5 has about a 0.5 μm thickness. The p-layer 6 has about 1.0 μm thickness and has a $2 \times 10^{17}/cm^3$ hole concentration. Nickel electrodes 7 and 8 are connected to the p-layer 6 and the $n^+$-layer 4, respectively. They are electrically insulated by a groove 9.

The LED 10 is produced by gaseous phase epitaxial growth, called metal organic vapor phase epitaxy referred to as MOVPE hereinafter.

The gases employed in this process are ammonia ($NH_3$), a carrier gas ($H_2$ or $N_2$), trimethyl gallium ($Ga(CH_3)_3$) (TMG hereinafter), trimethyl aluminum ($Al(CH_3)_3$) (TMA hereinafter), trimethyl indium ($In(CH_3)_3$) (TMI hereinafter), dimethylcadmium (($Cd(CH_3)_2$) (DMCd hereinafter), silane ($SiH_4$), and biscyclopentadienyl magnesium ($Mg(C_5H_5)_2$) ($CP_2Mg$ hereinafter).

The single crystalline sapphire substrate 1, whose main surface 'a' was cleaned by an organic washing solvent and heat treatment, was placed on a susceptor in a reaction chamber for the MOVPE treatment. Then the sapphire substrate 1 was etched at 1100° C. by a vapor of $H_2$ fed into the chamber at a flow rate of 2 liter/min. under normal pressure for a period of 5 min.

On the etched sapphire substrate 1, a 500 Å thick AlN buffer layer 2 was formed on the surface 'a' under conditions of lowering the temperature in the chamber to 400° C., keeping the temperature constant, and supplying $H_2$ at a flow rate of 20 liter/min., $NH_3$ at 10 liter/min., and TMA at $1.8\times10^{-5}$ mol/min. for a period of about 90 sec. On the buffer layer 2, about a 2.2 μm thick Si-doped GaN $n^+$-layer 3 of high carrier concentration with an electron concentration of about $2\times10^{18}/cm^3$ was formed under conditions of keeping the temperature of the sapphire substrate 1 at 1150° C. and supplying $H_2$ at a flow rate of 20 liter/min., $NH_3$ at 10 liter/min., TMG at $1.7\times10^{-4}$ mol/min., and diluted silane to 0.86 ppm by $H_2$ at 200 ml/min. for thirty minutes, respectively.

The following manufacturing process provides for an emission layer 5 as an active layer, an $n^+$-layer 4 of high carrier concentration and a p-layer 6 as clad layers; the LED 10 is designed to emit at a 430 nm wavelength peak in the luminous spectrum and has luminous centers of Cd and Si.

On the $n^+$-layer 3, about a 0.5 μm thick Si-doped $(Al_{0.47}Ga_{0.53})_{0.9}In_{0.1}N$ $n^+$-layer 4 of high carrier concentration with an electron concentration of $1\times10^{18}/cm^3$ was formed under conditions of keeping the temperature of the sapphire substrate 1 at 850° C. and supplying $N_2$ or $H_2$ at a flow rate of 10 liter/min., $NH_3$ at 10 liter/min., TMG at $1.12\times10^{-4}$ mol/min., TMA at $0.47\times10^{-4}$ mol/min., TMI at $0.1\times10^{-4}$ mol/min., and diluted silane to 0.86 ppm by $H_2$ at $10\times10^{-9}$ mol/min. for 60 min.

On the $n^+$-layer 4, about a 0.5 μm thick Cd and Si-doped $(Al_{0.3}Ga_{0.7})_{0.94}In_{0.06}N$ emission layer 5 was formed under conditions of keeping the temperature of the sapphire substrate 1 at 850° C. and supplying $N_2$ or $H_2$ at a flow rate of 20 liter/min., $NH_3$ at 10 liter/min., TMG at $1.53\times10^{-4}$ mol/min., TMA at $0.47\times10^{-4}$ mol/min., TMI $0.02\times10^{-4}$ mol/min., DMCd at $2\times10^{-7}$ mol/min., and diluted silane to 0.86 ppm by $H_2$ at $10\times10^{-9}$ mol/min. for 60 min. At this stage, the layer 5 exhibited high resistivity. The impurity concentrations of Cd and Si doped to the emission layer 5 were $5\times10^{18}/cm^3$ and $1\times10^{18}/cm^3$, respectively.

On the emission layer 5, about a 1.0 μm thick Mg-doped $(Al_{0.47}Ga_{0.53})_{0.9}In_{0.1}N$ p-layer 6 was formed under conditions of keeping the temperature of the sapphire substrate 1 at 1100° C. and supplying $N_2$ or $H_2$ at a flow rate of 20 liter/min., $NH_3$ at 10 liter/min., TMG at $1.12\times10^{-4}$ mol/min., TMA at $0.47\times10^{-4}$ mol/min., TMI at $0.1\times10^{-4}$ mol/min., and $CP_2Mg$ at $2\times10^{-4}$ mol/min. for 120 min. Resistivity of the p-layer 6 was $10^8$ Ω.cm or more exhibiting insulative characteristics. The impurity concentration of the Mg doped into the p-layer 6 was $1\times10^{20}/cm^3$.

Figure 2:
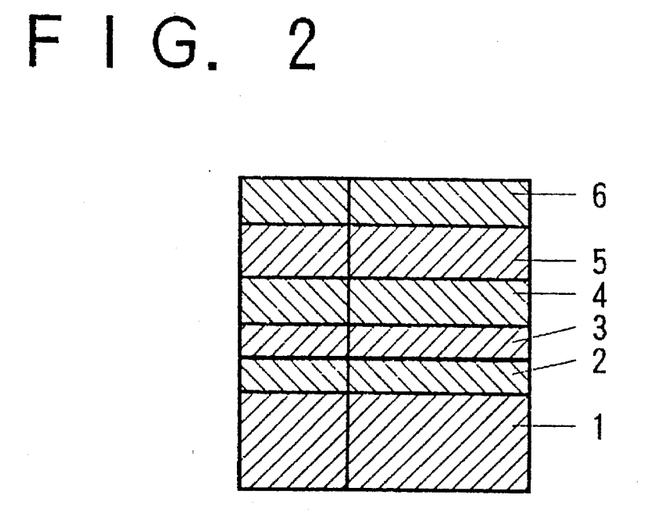
FIGS. 2 through 7 are sectional views illustrating successive steps of producing the LED embodied in the example.

Then, electron rays were uniformly irradiated into the p-layer 6 using a reflective electron beam diffraction device. The irradiation conditions were set at 10 KV for the accelerating voltage, 1 μA for the sample current, 0.2 mm/sec. for the speed of the beam scanning, 60 μmφ for the beam aperture, and at $5.0\times10^{-5}$ Torr vacuum. This irradiation changed the insulative p-layer 6 into a p-type conductive semiconductor with a hole concentration of $2\times10^{17}/cm^3$ and a resistivity of 2 Ω.cm. Thereby, a wafer with multi-structural layers was obtained as shown in FIG. 2.

FIGS. 3 to 7 show sectional views of the formations of an individual device on the wafer. In actual practice and in accordance with industry custom, a wafer with a large number of elements thereon is treated by the following process and divided or diced into individual devices.

Figure 3:
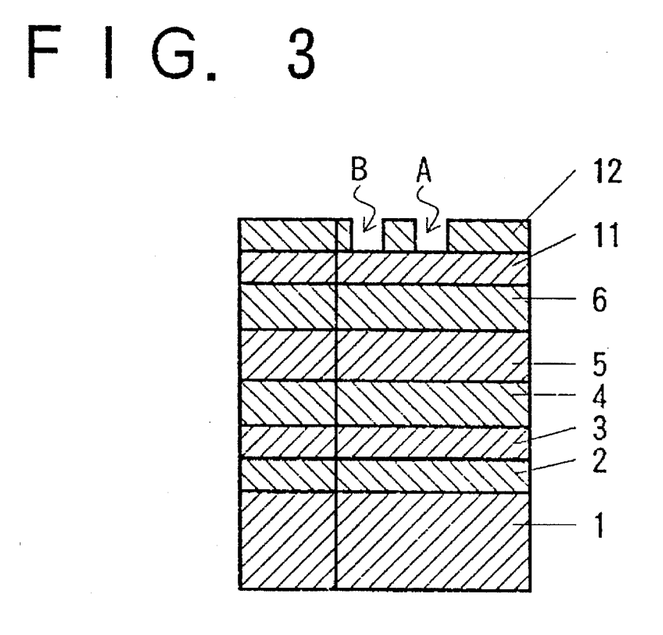
Figure 5:
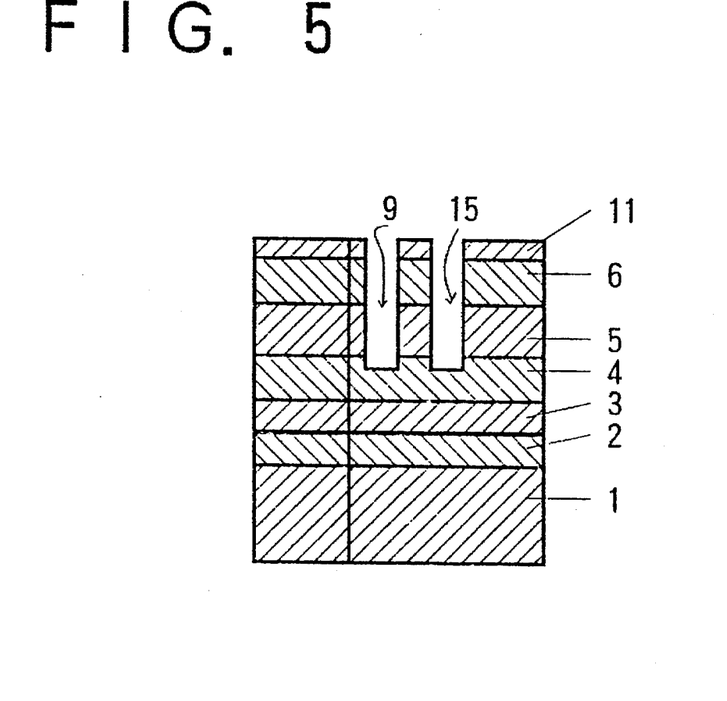

A 2000 Å thick $SiO_2$ layer 11 was formed on the p-layer 6 by sputtering. Then, the layer 11 was coated with a photoresist layer 12. Two selected parts or areas of the photoresist layer 12, named A and B, were removed by photolithography as shown in FIG. 3. The part or area A is an electrode-forming aperture which corresponds to a place where a hole 15, shown in FIG. 5, is formed extending to and into the $n^+$-layer 4 of high carrier concentration. The part or area B corresponds to a place where a trench-like isolation groove 9, shown in FIGS. 5 and 6, is formed for insulating or electrically insulating the part or area A from an electrode in contact with the p-layer 6.

Figure 4:
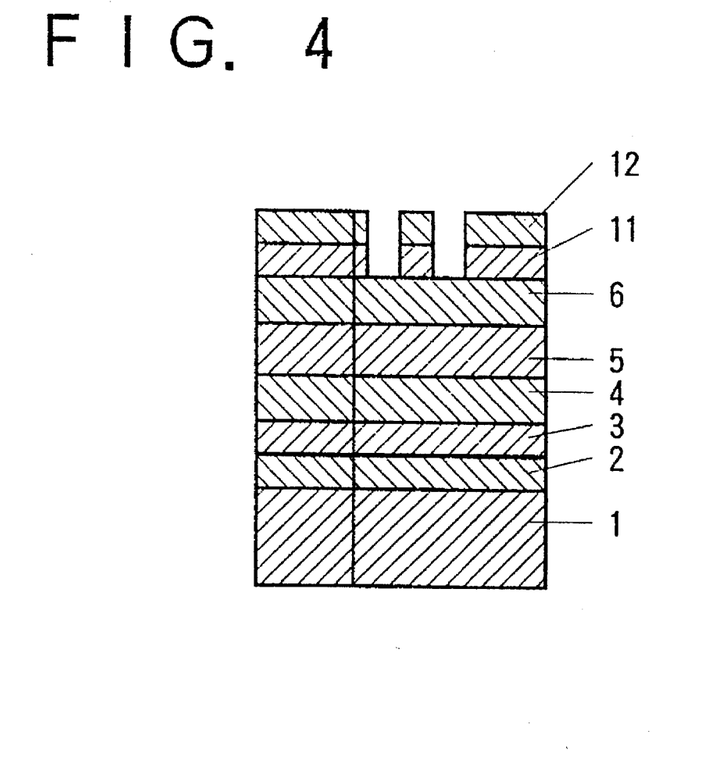

As shown in FIG. 4, two parts of the $SiO_2$ layer 11 which were not covered with the photoresist layer 12 were etched off by an etching liquid such as hydrofluoric acid. Then, the exposed part of the following successive three layers from the surface of the device, the p-layer 6, the emission layer 5, and the upper part of the $n^+$-layer 4 of high carrier concentration, were removed by dry etching, or supplying a high-frequency power density of 0.44 $W/cm^2$ and $BCl_3$ gas of 10 ml/min. at a vacuum degree of 0.04 Torr as shown in FIG. 5. After that, dry etching with argon (Ar) was carried out on the device. Consequently, a hole 15 for forming an electrode reaching the $n^+$-layer 4 of high carrier concentration and a trench-like groove 9 for insulation purposes are formed.

Figure 6:
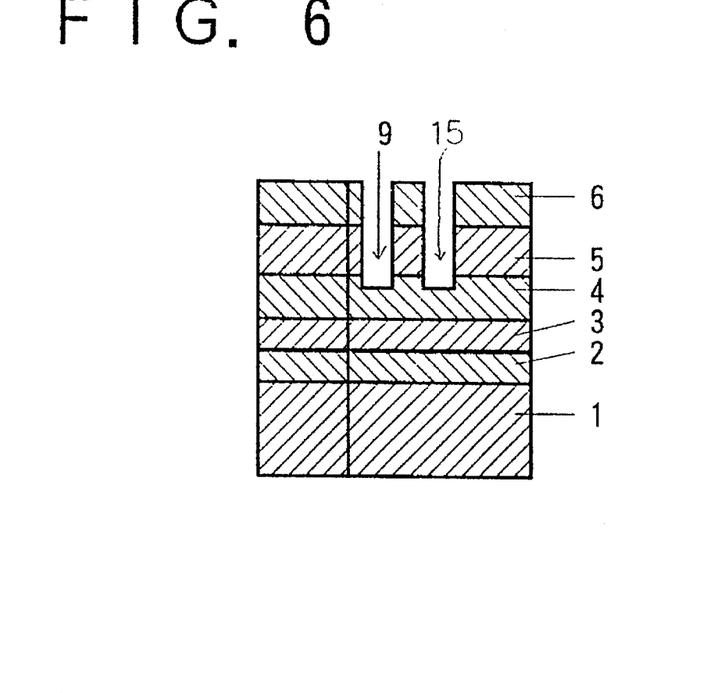
Figure 7:
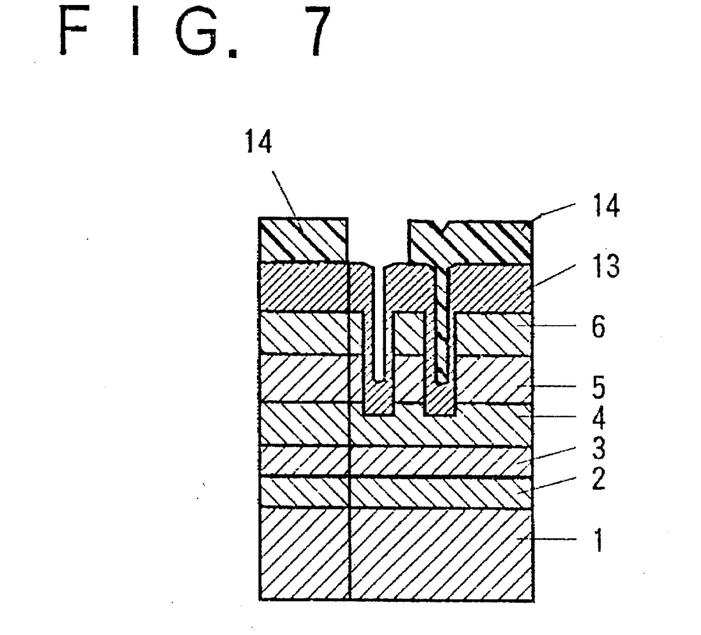

The $SiO_2$ layer 11 remaining on the p-layer 6 was removed by hydrofluoric acid as shown in FIG. 6. A nickel (Ni) layer 13 was laminated on the entire surface of the device by vapor deposition. Thus, the so-formed Ni layer 13 in the hole 15 is in electrical contact with the $n^+$-layer 4 of high carrier concentration. A photoresist 14 was deposited on the Ni layer 13. The photoresist 14 was then selectively etched off by photolithography leaving patterns of configuration (FIG. 7) for the to-be-formed electrodes connected to the $n^+$-layer 4 of high carrier concentration and the p-layer 6, respectively.

Using the photoresist 14 as a mask, the exposed part or area of the Ni layer 13 from the photoresist 14 was etched off by an etching liquid such as nitric acid. At this time, the nickel layer 13 laminated in the groove 9 was also removed completely. Then, the photoresist layer 14 was removed by a photoresist removal liquid such as acetone. There were formed two electrodes, the electrode 8 for the $n^+$-layer 4 of high carrier concentration and the electrode 7 for the p-layer 6. The trench-like groove 9 insulates the electrodes 7 and 8 from one another. A wafer treated with the above-mentioned process was divided or diced into each chip or element which thus constituted a gallium nitride light-emitting diode with a p-n junction structure as shown in FIG. 1.

Figure 8:
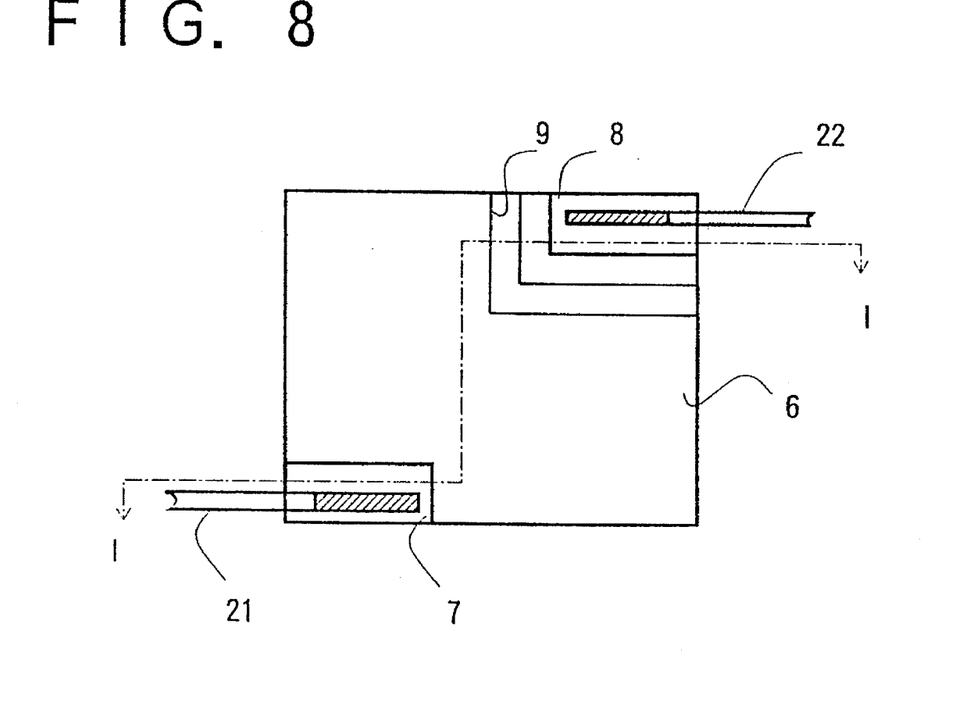
FIG. 8 is a top view of the LED embodied in the example showing its wedge-bonded structure.

As shown in FIG. 8, the first and second electrodes 7 and 8 were formed at opposite corners of the p-layer 6 in a strip-like shape. A chip with that electrode arrangement is placed on a lead frame (not shown). Aluminum bonding wires, or lead lines, 21 and 22, connect the first and second electrodes 7 and 8 with land terminals not shown) of the lead pins by a wedge bonding method, respectively. As is known in the art, wedge bonding is effected by a force applying tool, usually ultrasonically excited, that forces a segment of the bonding wire at its remote end into electrical contact with the bonding pad. As can be appreciated, the respective surface areas occupied by the first and second electrodes 7 and 8 are minimized on the p-layer 6. Consequently, the luminous intensity of the LED 10 of FIGS. 1–8 is improved relative to the LED of FIG. 9.

The surface at a side of light outlet corresponds to the p-layer 6 in the above embodiment, i.e. the light emitting surface upon which the electrodes 7 and 8 are situated. The electrode 8 for the n$^+$-layer 4 was formed on the p-layer 6 and electrically insulated by the groove 9. Alternatively, the electrode 8 can be formed on the exposed part of the n$^+$-layer 4 removing portions of the p-layer 6 and the emission layer 5. In this case, the surface at a side of light outlet is the plane constituted by portions of the p-layer 6 and the n$^+$-layer 4.

Aluminum lead lines are used in this embodiment. Alternatively, gold (Au), silver (Ag), copper (Cu), and alloys made of any two of Au, Ag, and Cu can be used for that purpose.

The emission layer 5 preferably contains impurity concentrations of Cd and Si within a range of $1\times10^{17}$/cm$^3$ to $1\times10^{20}$/cm$^3$, respectively, in order to improve luminous intensity. It is further desirable that the concentration of Si is smaller than that of Cd by ten to fifty percent.

In order to make the band gap of the emission layer 5 smaller than those of its respective adjacent two layers, i.e., the p-layer 6 and the n$^+$-layer 4 of high carrier concentration, a double hereto-junction structure was utilized for the LED 10 in this embodiment. Alternatively, a single hetero-junction structure can be utilized. As a further variant, a homo-junction structure between the emission layer 5 made of GaN and the p-layer 6, and the homo-junction structure between the GaN emission layer 5 and the n$^+$-layer 4 made of GaN can be used.

Further, it is preferable that the composition ratios of Al, Ga, and In in the respective three layers 4, 5, and 6 are selectively designed to meet with or match the lattice constant of GaN in the n$^+$-layer 3 of high carrier concentration as precisely as possible.

The emission layer 5 in the embodiment is doped with Cd and Si. Alternatively, it can be doped with Zn and Si.

When Si and Zn are doped to the emission layer 5 as impurities, their preferable impurity concentration is in the $1\times10^{17}$/cm$^3$ to $1\times10^{20}$/cm$^3$ range, respectively. The concentration is more preferable in the $1\times10^{18}$/cm$^3$ to $1\times10^{19}$/cm$^3$ range. It is not preferable that the impurity concentration be lower than $1\times10^{18}$/cm$^3$, because the luminous intensity of the LED decreases as a result. It is not desirable that the impurity concentration is higher than $1\times10^{19}$/cm$^3$, because poor crystallinity occurs. The preferable concentration of Si is ten to one-tenth as that of Zn. The most preferable concentration of Si is in the one to one-tenth range of Zn.

When the concentration of Si is higher than that of Cd, the emission layer 5 exhibits semi-insulation characteristic. When the concentration of Si is lower than that of Cd, the emission layer 5 exhibits n-type conduction.

In the embodiment, Cd was employed as an acceptor impurity and Si as a donor impurity. Alternatively, beryllium (Be), magnesium (Mg), zinc (Zn), and mercury (Hg) can be used as an acceptor impurity. Alternatively, carbon (C), germanium (Ge), tin (Sn), lead (Pb), sulfur (S), selenium (Se), and tellurium (Te) can be used as a donor impurity.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A light-emitting semiconductor device comprising:

an n-layer having n-type conduction of a Group III nitride compound semiconductor satisfying a first formula $Al_{x3}Ga_{y3}In_{1-x3-y3}N$, where $0<x3<1$, $0<y3<1$, and $0<x3+y3<1$;

an emission layer of a Group III nitride compound semiconductor satisfying a third formula $Al_{x2}Ga_{y2}In_{1-x2-y2}N$, where $0<x2<1$, $0<y2<1$, and $0<x2+y2<1$;

a p-layer having p-type conduction of a Group III nitride compound semiconductor satisfying a second formula $Al_{x1}Ga_{y1}In_{1-x1-y1}N$, where $0<x1<1$, $0<y1<1$, and $0<x1+y1<1$;

a first electrode electrically contacting said p-layer, having a small stripe shape, and being formed on a first corner of a light-emitting side of said light-emitting semiconductor device; and a second electrode electrically contacting said n-layer, having a small stripe shape, and being formed on a second corner across from said first corner of said light-emitting side of said light-emitting semiconductor device;

a first lead wire wedge-bonded to said first electrode; and a second lead wire wedge-bonded to said second electrode;

a junction structure of said n-layer, said p-layer, and said emission layer being any one of a homo-junction structure, a single hetero-junction structure, and a double hetero-junction structure.

2. A light-emitting device according to claim 1, wherein:

said light-emitting side of said light-emitting semiconductor device is formed by said p-layer; and a first portion of said p-layer where said second electrode is formed is electrically insulated by a groove from a second portion of said p-layer where light from said p-layer is output.

3. A light-emitting device according to claim 1, wherein said light-emitting side of said light-emitting semiconductor device comprises:

a portion where light from said p-layer is output; and a portion of said n-layer having said emission layer removed therefrom.

4. A light-emitting device according to claim 1, wherein:

said first lead wire and said second lead wire are wedge-bonded respectively to said first electrode and said second electrode in parallel with each other and to respective cleaved sides of said light-emitting semiconductor device.

5. A light-emitting device according to claim 1, wherein:

a plane of said light-emitting side of said light-emitting semiconductor device has a square shape.

6. A light-emitting semiconductor device comprising:

a substrate layer;

a first conduction layer formed on said substrate layer;

an emission layer of a Group III nitride compound semiconductor formed on said first conduction layer;

a second conduction layer formed on said emission layer, said second conduction layer formed on a light-emitting side of said light-emitting semiconductor device;

a first electrode in electrical contact with a first corner portion of said second conduction layer, said first electrode having a width significantly smaller than a length of said first electrode;

a first lead wire wedge-bonded to said first electrode;

a second electrode in electrical contact with a second corner portion different from said first corner portion of said second conduction layer, said second electrode having a width significantly smaller than a length of said second electrode; and a second lead wire wedge-bonded to said second electrode.

7. A light-emitting semiconductor device according to claim 6, wherein:

said first conduction layer, said emission layer, and said second conduction layer form a homo-junction structure.

8. A light-emitting semiconductor device according to claim 6, wherein:

said first conduction layer, said emission layer, and said second conduction layer form a single hereto-junction structure.

9. A light-emitting semiconductor device according to claim 6, wherein:

said first conduction layer, said emission layer, and said second conduction layer form a double hetero-junction structure.

10. A light-emitting semiconductor device according to claim 6, wherein:

a conduction type of one of said first conduction layer and said second conduction layer is an n-type conduction and is formed of a Group III nitride compound semiconductor satisfying a formula $Al_{x3}Ga_{y3}In_{1-x3-y3}N$, where $0<x3<1$, $0<y3<1$, and $0<x3+y3<1$.

11. A light-emitting semiconductor device according to claim 6, wherein:

a conduction type of one of said first conduction layer and said second conduction layer is a p-type conduction and is formed of a Group III nitride compound semiconductor satisfying a formula $Al_{x1}Ga_{y1}In_{1-x1-y1}N$, where $0<x1<1$, $0<y1<1$, and $0<x1+y1<1$.

12. A light-emitting semiconductor device according to claim 11, wherein:

a conduction type of the other of said first conduction layer and said second conduction layer is a p-type conduction and is formed of a Group III nitride compound semiconductor satisfying a formula $Al_{x1}Ga_{y1}In_{1-x1-y1}N$, where $0<x1<1$, $0<y1<1$, and $0<x1+y1<1$.

13. A light-emitting semiconductor device according to claim 6, wherein:

a compound of said emission layer satisfies a formula $Al_{x2}Ga_{y2}In_{1-x2-y2}N$, where $0<2<1$, $0<y2<1$, and $0<x2+y2<1$.

14. A light-emitting semiconductor device according to claim 12, wherein:

a compound of said emission layer satisfies a formula $Al_{x2}Ga_{y2}In_{1-x2-y2}N$, where $0<x2<1$, $0<y2<1$, and $0<x2+y2<1$.

15. A light-emitting semiconductor device according to claim 6, wherein:

said lead lines are one of gold, silver and copper.

16. A light-emitting semiconductor device according to claim 6, wherein:

said lead lines are an alloy of any two of gold, silver and copper.

17. A light-emitting semiconductor device according to claim 6, wherein:

said emission layer contains impurity concentrations of Cd and Si.

18. A light-emitting semiconductor device according to claim 17, wherein:

said impurity concentration of Si is smaller than said impurity concentration of Cd by between 10 to 50 percent.

19. A light-emitting semiconductor device according to claim 18, wherein:

said impurity concentrations of Cd and Si are within a range of $1\times10^{17}/cm^{-3}$ to $1\times10^{20}/cm^3$, respectively.

20. A light-emitting semiconductor device according to claim 14, wherein:

composition ratios of Al, Ga and In in the first conduction layer, the emission layer, and the second conduction layer substantially match a lattice constant of GaN in said first conduction layer.

21. A light-emitting semiconductor device according to claim 6, wherein:

said emission layer contains impurity concentrations of Zn and Si.

22. A light-emitting semiconductor device according to claim 21, wherein:

said impurity concentration of Si is between one and one-tenth said impurity concentration of Zn.

23. A light-emitting semiconductor device according to claim 21, wherein:

said impurity concentrations of Cd and Zn are within a range of $1\times10^{17}/cm^3$ to $1\times10^{20}/cm^3$, respectively.

24. A light-emitting semiconductor device according to claim 21, wherein:

said impurity concentrations of Cd and Zn are within a range of $1\times10^{18}/cm^3$ to $1\times10^{19}/cm^3$, respectively.

25. A light-emitting semiconductor device according to claim 6, wherein said emission layer contains:

acceptor impurities selected from at least one of cadmium, beryllium, magnesium, zinc and mercury;

donor impurities selected from at least one of silicon, carbon, germanium, tin, lead, sulfur, selenium and tellurium.

26. A light-emitting semiconductor device comprising:

a light-emitting semiconductor device including a Group III nitride light emitting surface;

a first electrode in electrical contact with a first corner portion of said light emitting surface of said semiconductor device, said first electrode having a stripe shape with a width of said first electrode being significantly smaller than a length of said first electrode;

a first lead wire wedge-bonded to said first electrode;

a second electrode in electrical contact with a second corner portion different from said first corner portion of said light emitting surface of said semiconductor device, said second electrode having a stripe shape with a width of said second electrode being significantly smaller than a length of said second electrode; and a second lead wire wedge-bonded to said second electrode.

* * * * *

UNITED STATES PATENT AND TRADEMARK OFFICE
CERTIFICATE OF CORRECTION

PATENT NO. : 5,652,438
DATED : July 29, 1997
INVENTOR(S) : Sassa et al.

It is certified that error appears in the above-identified patent and that said Letters Patent is hereby corrected as shown below:

Col.7, lines 51-55 claims 13 "A light-emitting semiconductor device to claim 6, wherein:

a compound of said emission layer satisfies a formula $Al_{x2}Ga_{y2}In_{1-x2-y2}N$, where $0<2<1$, $0<y2<1$, and $0<x2+y2<1$" to --A light-emitting semiconductor device according to claim 6, wherein:

a compound of said emission layer satisfies a formula $Al_{x2}Ga_{y2}In_{1-x2-y2}N$, where $0\leq x2\leq 1$, $0\leq y2\leq 1$, and $0\leq x2+y2\leq 1$--.

Col. 8 line 15 claim 19, "$1\times 10^{17}/cm^{-3}$" to --$1\times 10^{17}/cm^{3}$--.

Signed and Sealed this

First Day of June, 1999

*Attest:*

Q. TODD DICKINSON

*Attesting Officer*    *Acting Commissioner of Patents and Trademarks*

UNITED STATES PATENT AND TRADEMARK OFFICE
CERTIFICATE OF CORRECTION

PATENT NO. : 5,652,438

DATED : Jul. 29, 1997

INVENTOR(S) : Sassa et al.

It is certified that error appears in the above-identified patent and that said Letters Patent is hereby corrected as shown below:

Column 6, line 10, Claim 1, change "$0<x3<1. \ 0<y3<1.$ and $0<x3+$" to
--$0 \leq x3 \leq 1, \ 0 \leq y3 \leq 1,$ and $0 \leq x3+$--;
line 11, change "$y3<1$" to --$y3 \leq 1$--;
line 14, change "$0<x2<1, \ 0<y2<1,$ and $0<x2+y2<1$" to
--$0 \leq x2 \leq 1, \ 0 \leq y2 \leq 1,$ and $0 \leq x2+y2 \leq 1$--
line 17, change "$0<x1<1, \ 0<y1<1,$ and $0<x1+$" to
--$0 \leq x1 \leq 1, \ 0 \leq y1 \leq 1,$ and $0 \leq x1+$--;
line 18, change "$y1<1$" to --$y1 \leq 1$--.

Column 7, line 34, Claim 10, change "$0<x3<1, \ 0<y3<1,$ and $0<x3+y3<1$" to
--$0 \leq x3 \leq 1, \ 0 \leq y3 \leq 1,$ and $0 \leq x3+y3 \leq 1$--.

UNITED STATES PATENT AND TRADEMARK OFFICE
CERTIFICATE OF CORRECTION

PATENT NO.     : 5,652,438

DATED          : Jul. 29, 1997

INVENTOR(S)    : Sassa et al.

It is certified that error appears in the above-identified patent and that said Letters Patent is hereby corrected as shown below:

Column 7, line 41, Claim 11, change "$0<x1<1, 0<y1<1$ and $0<x1+y1<1$" to
--$0 \leq x1 \leq 1, 0 \leq y1 \leq 1$ and $0 \leq x1+y1 \leq 1$--.

Column 7, line 48, Claim 12, change "$0<x1<1, 0<y1<1$, and $0<x1+y1<1$" to
--$0 \leq x1 \leq 1, 0 \leq y1 \leq 1$, and $0 \leq x1+y1 \leq 1$--.

Column 7, line 57, Claim 14, change "$0<x2<1, 0<y2<1$, and $0<x2+$" to
--$0 \leq x2 \leq 1, 0 \leq y2 \leq 1$, and $0 \leq x2+$--;
line 58, change "$y2<1$" to --$y2 \leq 1$--.

Signed and Sealed this

Thirtieth Day of November, 1999

Attest:

Q. TODD DICKINSON

Attesting Officer

Acting Commissioner of Patents and Trademarks